United States Patent
Huang et al.

(10) Patent No.: US 11,844,250 B2
(45) Date of Patent: Dec. 12, 2023

(54) DISPLAY PANEL INCLUDING GROOVED INORGANIC LAYER IN BENDING AREA AND DISPLAY DEVICE INCLUDING DISPLAY PANEL

(71) Applicants: Chengdu BOE Optoelectronics Technology Co., Ltd., Chengdu (CN); BOE Technology Group Co., Ltd., Beijing (CN)

(72) Inventors: Yao Huang, Beijing (CN); Benlian Wang, Beijing (CN); Yue Long, Beijing (CN); Weiyun Huang, Beijing (CN); Yingsong Xu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 142 days.

(21) Appl. No.: 17/414,383

(22) PCT Filed: Sep. 17, 2020

(86) PCT No.: PCT/CN2020/115981
§ 371 (c)(1),
(2) Date: Jun. 16, 2021

(87) PCT Pub. No.: WO2022/056789
PCT Pub. Date: Mar. 24, 2022

(65) Prior Publication Data
US 2022/0310749 A1    Sep. 29, 2022

(51) Int. Cl.
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02)

(58) Field of Classification Search
CPC ............ H01L 27/3276; H01L 51/0097; H01L 2251/5338
See application file for complete search history.

(56) References Cited

U.S. PATENT DOCUMENTS

| 10,916,185 B1* | 2/2021 | Dai ........................ G09G 3/32 |
| 2006/0103620 A1* | 5/2006 | Joo ..................... G09G 3/3611 |
| | | 345/98 |

(Continued)

FOREIGN PATENT DOCUMENTS

| CN | 107833906 A | 3/2018 |
| CN | 108899340 A | 11/2018 |

(Continued)

*Primary Examiner* — Lex H Malsawma
*Assistant Examiner* — Sean Ayers Winters
(74) *Attorney, Agent, or Firm* — ArentFox Schiff LLP; Michael Fainberg

(57) ABSTRACT

Embodiments of the present disclosure disclose a display panel and a display device. The display panel includes: a base substrate, a low temperature poly-silicon semiconductor layer, an oxide semiconductor layer and a source-drain metal layer, wherein the source-drain metal layer corresponding to a bending region is provided with a plurality of mutually insulated traces extending in a first direction and arranged in a second direction; an inorganic layer between the base substrate and the source-drain metal layer, wherein the inorganic layer is provided with a groove in the bending region, and the traces are disposed above the groove; and a flexible insulating material between the inorganic layer in the bending region and the traces, wherein the flexible insulating material fills the groove.

18 Claims, 10 Drawing Sheets

(56) References Cited

U.S. PATENT DOCUMENTS

| | | | |
|---|---|---|---|
| 2014/0361437 A1* | 12/2014 | Seo | H01L 23/13 |
| | | | 257/773 |
| 2015/0137102 A1 | 5/2015 | Yang | |
| 2018/0286938 A1* | 10/2018 | Moon | H10K 77/111 |
| 2019/0204668 A1* | 7/2019 | Yang | H01L 29/7869 |
| 2019/0220644 A1* | 7/2019 | Sun | H10K 50/844 |
| 2019/0287433 A1 | 9/2019 | Huang et al. | |
| 2021/0098509 A1* | 4/2021 | Fu | H01L 27/1225 |
| 2021/0305284 A1* | 9/2021 | He | H01L 29/66757 |
| 2022/0320211 A1* | 10/2022 | Zhao | H10K 59/131 |

FOREIGN PATENT DOCUMENTS

| | | | | |
|---|---|---|---|---|
| CN | 110047880 A | * | 7/2019 | H01L 27/323 |
| KR | 20150059048 A | | 5/2015 | |

* cited by examiner

DISPLAY PANEL INCLUDING GROOVED INORGANIC LAYER IN BENDING AREA AND DISPLAY DEVICE INCLUDING DISPLAY PANEL

The present disclosure is a National Stage of International Application No. PCT/CN2020/115981, filed on Sep. 17, 2020, the content of which is incorporated herein by reference in its entirety.

FIELD

The present disclosure relates to the field of display technology and in particular to a display panel and a display device.

BACKGROUND

A low temperature polycrystalline oxide (LTPO) substrate is a novel display panel with advantages of a low temperature poly-silicon (LTPS) substrate and an oxide substrate, and is regarded as the main development direction for display panels in the future. Therein, the LTPS substrate refers to a display panel in which a thin film transistor (TFT) in a display unit is an LTPS TFT. The oxide substrate refers to a display panel in which a TFT in a display unit is an oxide TFT, the LTPO substrate refers to a display panel including an LTPS TFT and an oxide TFT in each display unit, and the display unit is also called a sub-pixel.

SUMMARY

An embodiment of the present disclosure provides a display panel including:

a base substrate including a display region and a bending region adjacent to the display region;

a low-temperature poly-silicon semiconductor layer in a display region of the base substrate;

an oxide semiconductor layer in the display region of the base substrate;

a source-drain metal layer, wherein the source-drain metal layer corresponding to the bending region is provided with a plurality of mutually insulated traces extending in a first direction and arranged in a second direction, and the source-drain metal layer corresponding to the display region is provided with a plurality of mutually insulated signal lines extending in the first direction and arranged in the second direction; the second direction is a direction of extension of a bending axis within the bending region, and the first direction is a horizontal direction perpendicular to the second direction; and signals on the traces include signals transmitted by a transistor in which the low-temperature poly-silicon semiconductor layer is located and signals transmitted by a transistor in which the oxide semiconductor layer is located;

an inorganic layer between the base substrate and the source-drain metal layer, wherein the inorganic layer is provided with a groove in the bending region, and the traces are disposed above the groove; and a flexible insulating material between the inorganic layer and the traces in the bending region, wherein the flexible insulating material fills the groove.

Optionally, in the display panel provided by the embodiment of the present disclosure, the flexible insulating material fills up the groove, and a thickness of the flexible insulating material is larger than a depth of the groove.

Optionally, in the display panel provided by the embodiment of the present disclosure, the inorganic layer has a first thickness and a second thickness at the groove region, the first thickness is larger than the second thickness, and the traces are disposed above the inorganic layer of the first thickness.

Optionally, in the display panel provided by the embodiment of the disclosure, the traces include: first traces and second traces on outermost sides within the groove, and a plurality of third traces between the first traces and second traces; and a side of the first traces away from the third traces has the inorganic layer of the second thickness, a side of the second trace away from the third traces has the inorganic layer of the second thickness, and the inorganic layer of the first thickness is between the first traces and the second traces.

Optionally, in the display panel provided by the embodiment of the disclosure, any adjacent traces have the inorganic layer of the second thickness therebetween.

Optionally, in the display panel provided by the embodiment of the present disclosure, the traces include: first and second traces on an outermost side; and a side of the first traces away from third traces has the inorganic layer of the second thickness, and a side of the second traces away from the third traces has the inorganic layer of the second thickness.

Optionally, in the display panel provided by the embodiment of the present disclosure, the second thickness is 0.

Optionally, in the display panel provided by the embodiment of the present disclosure, the source-drain metal layer is a first source-drain metal layer, and the display panel further includes: a first flat layer on a side of the first source-drain metal layer away from the base substrate, a second source-drain metal layer on a side of the first flat layer away from the base substrate, a second flat layer on a side of the second source-drain metal layer away from the base substrate, and an anode on a side of the second flat layer away from the base substrate; and the first flat layer and the second flat layer cover the bending region.

Optionally, in the display panel provided by the embodiment of the present disclosure, the source-drain metal layer is a second source-drain metal layer, and the display panel further includes: a first flat layer between the second source-drain metal layer and the oxide semiconductor layer, a first source-drain metal layer between the first flat layer and the oxide semiconductor layer, a second flat layer on a side of the second source-drain metal layer away from the base substrate, and an anode on a side of the second flat layer away from the base substrate; and the first flat layer is made of the flexible insulating material and the second flat layer covers the bending region.

Optionally, the display panel provided by the embodiment of the present disclosure further includes: a barrier layer and a first buffer layer stacked in sequence between the base substrate and the low-temperature poly-silicon semiconductor layer, a first gate insulating layer, a first gate layer, a second gate insulating layer, a light-blocking layer, a second buffer layer and a third buffer layer stacked in sequence between the low-temperature poly-silicon semiconductor layer and the oxide semiconductor layer, a second gate layer between the oxide semiconductor layer and the first source-drain metal layer, a third gate insulating layer between the second gate layer and the oxide semiconductor layer, and an interlayer insulating layer between the second gate layer and the first source-drain metal layer; wherein the barrier layer, the first buffer layer, the first gate insulating layer, the second gate insulating layer, the second buffer layer, the third buffer layer, the third gate insulating layer, and the interlayer insulating layer constitute the inorganic layer.

Correspondingly, an embodiment of the present disclosure also provides a display device including the display panel provided by the embodiment of the present disclosure.

DETAILED DESCRIPTION OF THE EMBODIMENTS

Figure 1:
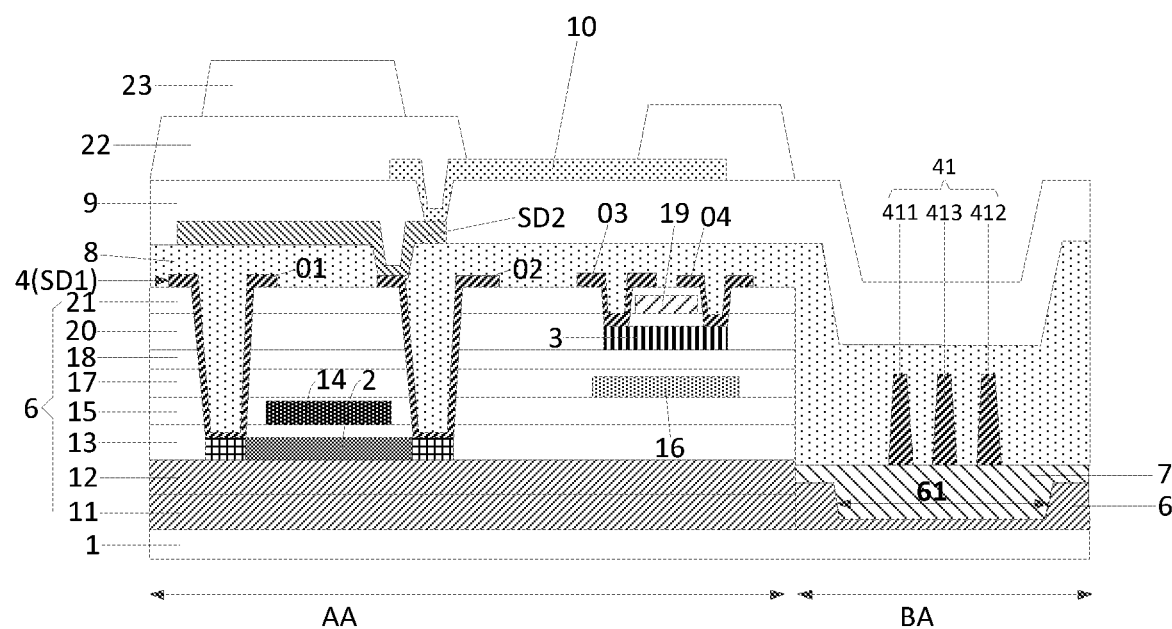
FIG. 1 is a schematic partial cross-sectional structural diagram of a display panel according to embodiments of the present disclosure.

In order to make the objects, technical solutions and advantages of embodiments of the present disclosure clearer, the technical solutions of the embodiments of the present disclosure will be clearly and completely described below in conjunction with the accompanying drawings of the embodiments of the present disclosure. Obviously, the described embodiments are a part of, but not all, the embodiments of the present disclosure. The embodiments of the present disclosure and features of the embodiments may be combined with each other in case of no conflict. Based on the described embodiments of the present disclosure, all other embodiments obtained by those of ordinary skill in the art without inventive effort fall within the scope of protection of the present disclosure.

Unless otherwise defined, technical or scientific terms used herein are to be taken as commonly understood by those of ordinary skill in the art to which this disclosure belongs. The words "include", "comprise" and the like used in this disclosure mean that elements or items preceding the word appear to include elements or items listed after the word and equivalents thereof, but not to the exclusion of other elements or items. "Connect" or "connected" and the like are not restricted to physical or mechanical connections, but can include electrical connections, whether direct or indirect. "Inner", "outer", "upper", "lower" and the like are only used to indicate relative positional relationships, which may change accordingly when the absolute position of the object being described changes.

It is noted that the sizes and shapes of the figures in the drawings do not reflect the true scale, but are merely illustrative of the content of the present disclosure. The same or similar reference numerals throughout refer to the same or similar elements or elements having the same or similar function.

A display panel, which is a major component of a display device, includes a base substrate and a display unit disposed on the base substrate, and the display unit includes a thin film transistor (TFT). An LTPS substrate refers to a display panel in which the TFT in the display unit is an LTPS TFT, and an oxide substrate refers to a display panel in which the TFT in the display unit is an oxide TFT. Large mobility of a poly-silicon active layer results in large leakage current (Ioff) of the LTPS TFT, and the LTPS substrate has large power consumption under low frequency driving, difficulty in maintaining a static black picture very well, and poor picture quality; moreover, for better gray scale development, in the LTPS substrate, a channel of a driver thin film transistor (DTFT) need to be made long, which makes it difficult to achieve high resolution of the LTPS substrate, wherein the resolution refers to pixels per inch (PPI). In addition, hysteresis of the poly-silicon active layer is large, and thus the LTPS substrate is prone to a picture residual image. Small mobility of an oxide active layer results in smaller leakage current of the oxide TFT, and the oxide substrate has small power consumption under low frequency driving, good retention of static black pictures, and better picture quality; moreover, in the oxide substrate, a channel of a DTFT do not need to be made long, leading to better gray scale development and high PPI. Besides, the hysteresis of the oxide active layer is small and the oxide substrate is less prone to the picture residual image problem; and further, the uniformity of the oxide TFT is better than that of the LTPS TFT.

From the above description, it can be seen that an oxide process can well compensate for some of the deficiency of an LTPS process. However, the LTPS process and the oxide process each have respective advantages and disadvantages, and therefore, combining them is a very competitive process solution. The process combining them is an LTPO process which is likely to be applied in the future in the development of high-end products.

A display panel based on the LTPO process is a LTPO substrate in which each display unit includes an LTPS TFT and an oxide TFT.

With continuous development of science and technology, the display technology has also continued to get updated. Future demands for displays have also gradually moved towards more convenient, fashionable and more widely applicable environments. Flexible devices made with flexible substrates are expected to become mainstream devices for the next generation electronic devices. A flexible display panel often use pad bending in a bonded region in order to achieve smaller boundary and high screen ratio. However, when pad bending is performed, there are a large number of inorganic layers and metal wires on the flexible substrate, and a reduction in bend radius causes a large concentration of stress, resulting in cracking of inorganic film layer of the display panel and breaking of the metal traces. Therefore, smooth conduction of electrical signals in the display panel cannot be realized.

Figure 2:
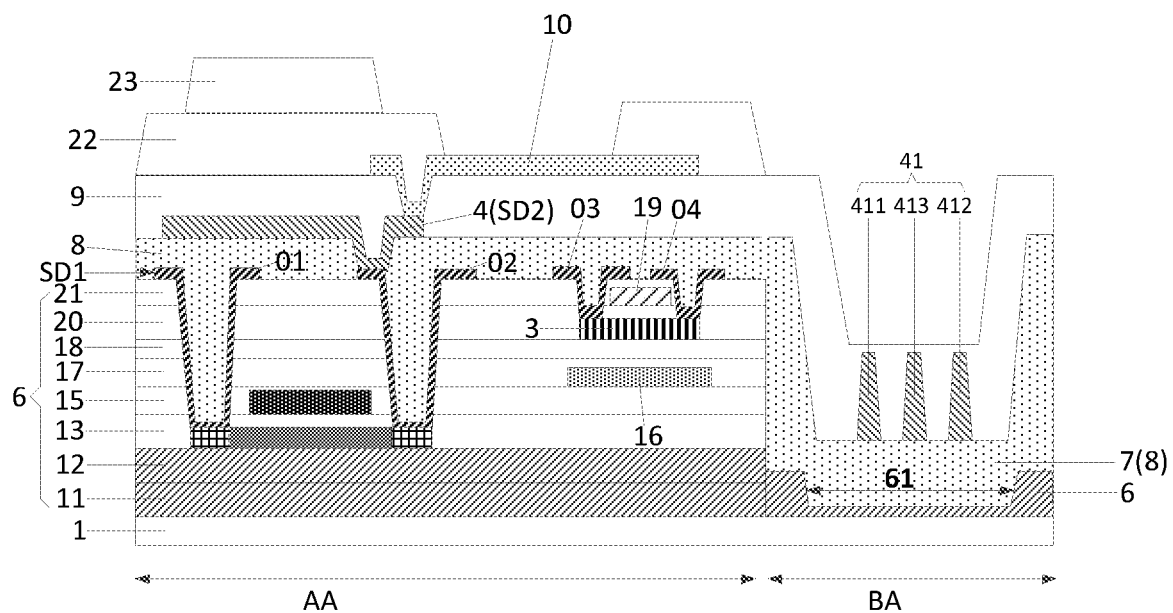
FIG. 2 is a schematic partial cross-sectional structural diagram of another display panel according to the embodiments of the present disclosure.
Figure 3:
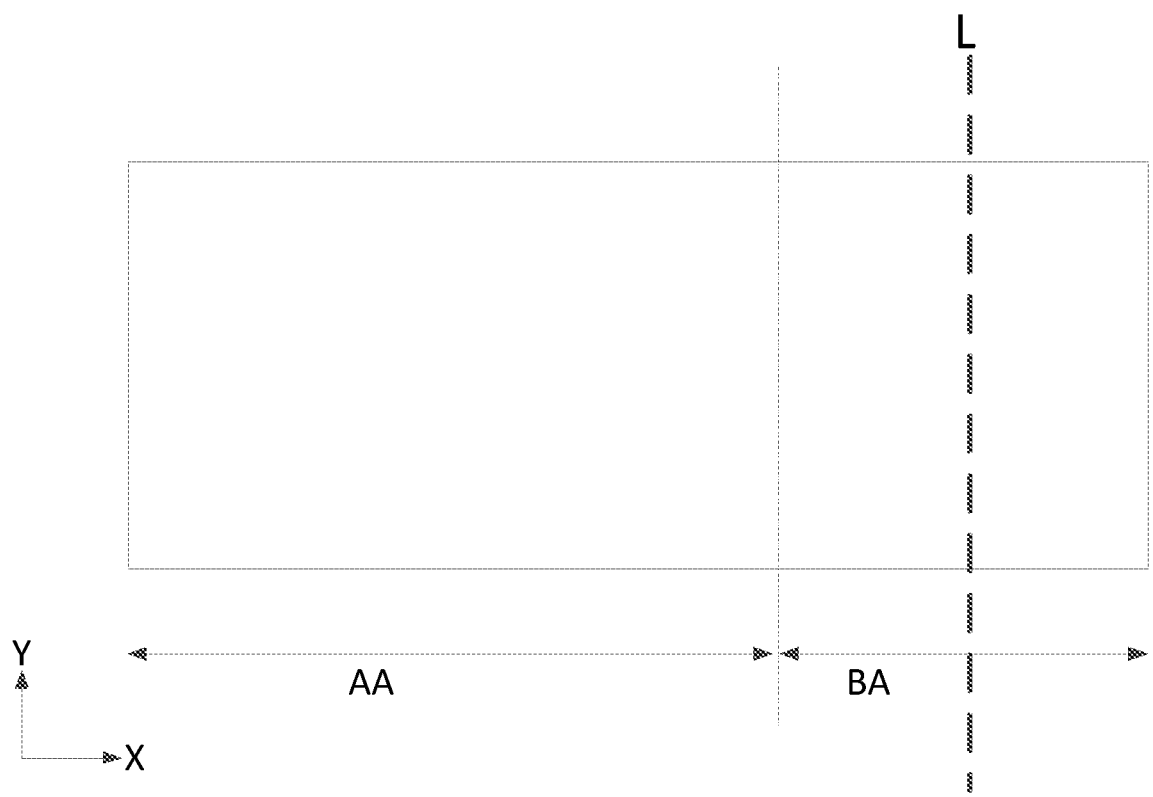
FIG. 3 is a schematic top view structure diagram of a display panel according to the embodiments of the present disclosure.

In order to solve the problem that an LTPO-based display panel cause cracking of inorganic film layers and breaking of metal traces when they are bent, an embodiment of the present disclosure provides a display panel as shown in FIGS. 1-3. FIG. 1 and FIG. 2 are schematic cross-sectional structural diagrams of film layers in the display panel, and FIG. 3 is a schematic top view of the display panel. The display panel includes:

a base substrate 1 including a display region AA and a bending region BA adjacent to the display region AA;

a low temperature poly-silicon semiconductor layer 2 in the display region AA of the base substrate 1;

an oxide semiconductor layer 3 in the display region AA of the base substrate 1; wherein the embodiment of the present disclosure is schematically illustrated by taking the oxide semiconductor layer 3 on a side of the low-temperature poly-silicon semiconductor layer 2 away from the base substrate 1 as example; and in particular, an orthographic projection of the oxide semiconductor layer 3 onto the base substrate 1 does not overlap with an orthographic projection of the low-temperature poly-silicon semiconductor layer 2 onto the base substrate 1;

a source-drain metal layer 4, wherein the source-drain metal layer 4 corresponding to the bending region BA is provided with a plurality of mutually insulated traces 41 extending in a first direction X and arranged in a second direction Y, and the source-drain metal layer 4 corresponding to the display region AA is provided with a plurality of mutually insulated signal lines 42 extending in the first direction X and arranged in the second direction Y; the second direction Y is a direction of extension of a bending axis L within the bending region BA, and the first direction X is a horizontal direction perpendicular to the second direction Y; and signals on the traces 41 include signals transmitted by a transistor in which the low-temperature poly-silicon semiconductor layer 2 is located and signals transmitted by a transistor in which the oxide semiconductor layer 3 is located;

an inorganic layer 6 between the base substrate 1 and the source-drain metal layer 4, wherein the inorganic layer 6 is provided with a groove 61 in the bending region BA, and the traces 41 are disposed above the groove 61; and a flexible insulating material 7 between the inorganic layer 6 and the traces 41 in the bending region BA, wherein the flexible insulating material 7 fills the groove 61.

According to the display panel provided by the embodiments of the present disclosure, by digging the groove 61 in the inorganic layer 6 in the bending region BA of the LTPO display panel and filling the groove 61 with the flexible insulating material 7, the bending performance of the bending region BA can be improved and problems of cracking the inorganic film layer and metal trace breakage caused by the LTPO-based display panel when bent are prevented.

During specific implementation, in the display panel provided by the embodiment of the present disclosure, as shown in FIGS. 1 and 2, the flexible insulating material 7 fills up the groove 61, and the flexible insulating material 7 has a thickness larger than the depth of the groove 61, which can further improve the bending performance of the LTPO-based display panel in the bending region BA.

During specific implementation, in the display panel provided by the embodiment of the present disclosure, as shown in FIGS. 4-9, the inorganic layer 6 has a first thickness D1 and a second thickness D2 in the region of the groove 61, the first thickness D1 is larger than the second thickness D2, and the traces 41 are disposed above the inorganic layer 6 of the first thickness D1.

Figure 4:
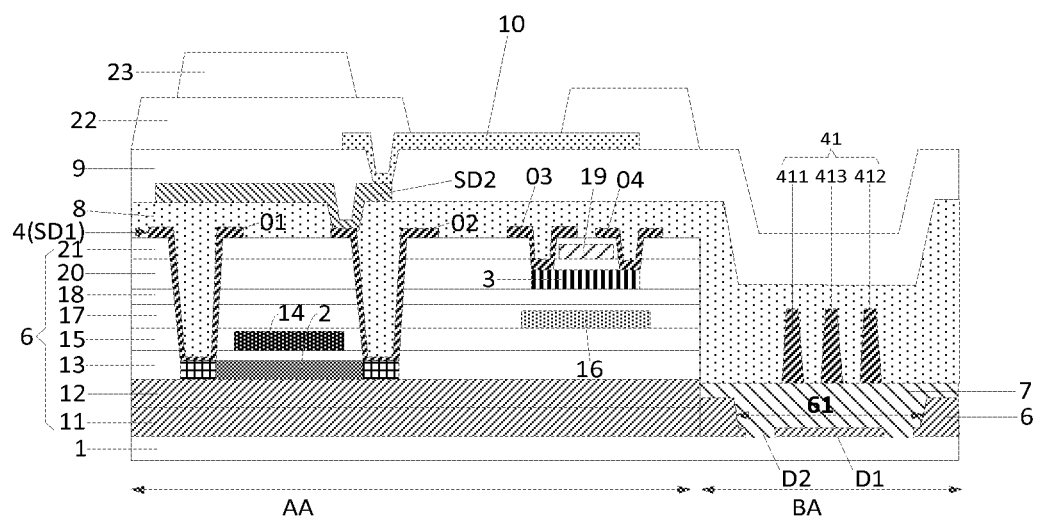
FIG. 4 is a schematic partial cross-sectional structural diagram of another display panel according to the embodiments of the present disclosure.
Figure 7:
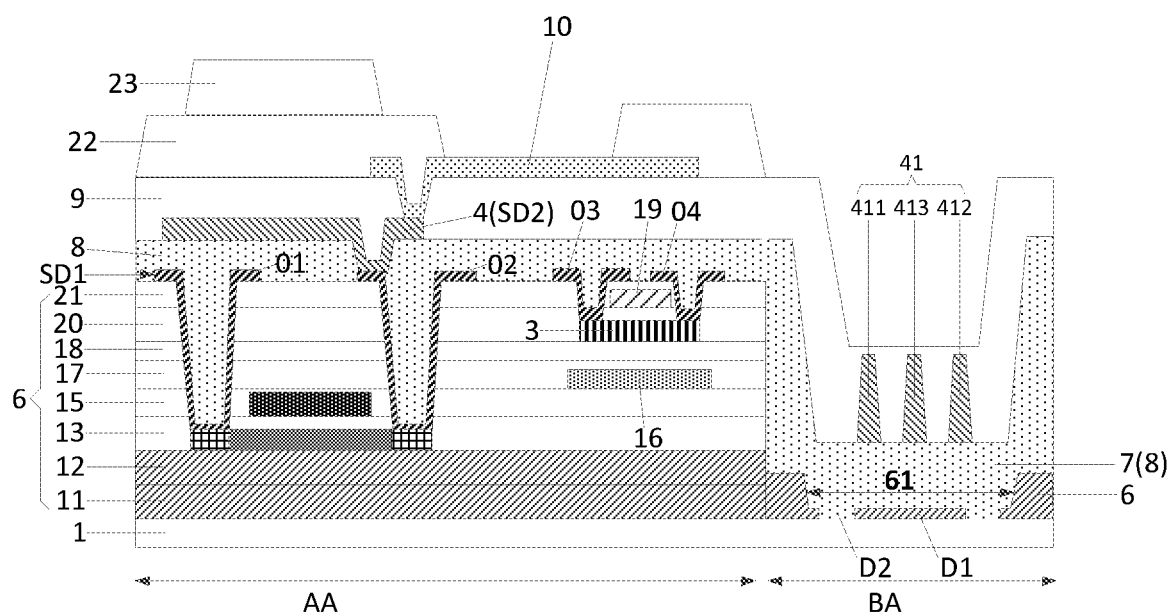
FIG. 7 is a schematic partial cross-sectional structural diagram of another display panel according to the embodiments of the present disclosure.

During specific implementation, in order to further improve the bending performance of the bending region, and prevent cracking of the inorganic film layer and the metal traces, in the display panel provided by the embodiment of the present disclosure, as shown in FIGS. 4 and 7, the traces 41 include: first and second traces 411 and 412 on outermost sides within the groove 61, and a plurality of third traces 413 (only one third trace 413 is illustrated) between the first and second traces 411 and 412; and a side of the first trace 411 away from the third traces 413 has the inorganic layer 6 of the second thickness D2, a side of the second trace 412 away from the third traces 413 has the inorganic layer 6 of the second thickness D2, and the inorganic layer 6 of the first thickness D1 is disposed between the first trace 411 and the second trace 412. By thinning the thickness of the inorganic layer 6 in regions outside the first and second traces 411 and 412 on outermost sides within the groove 61, the bending performance of the bending region BA can be further improved.

Figure 5:
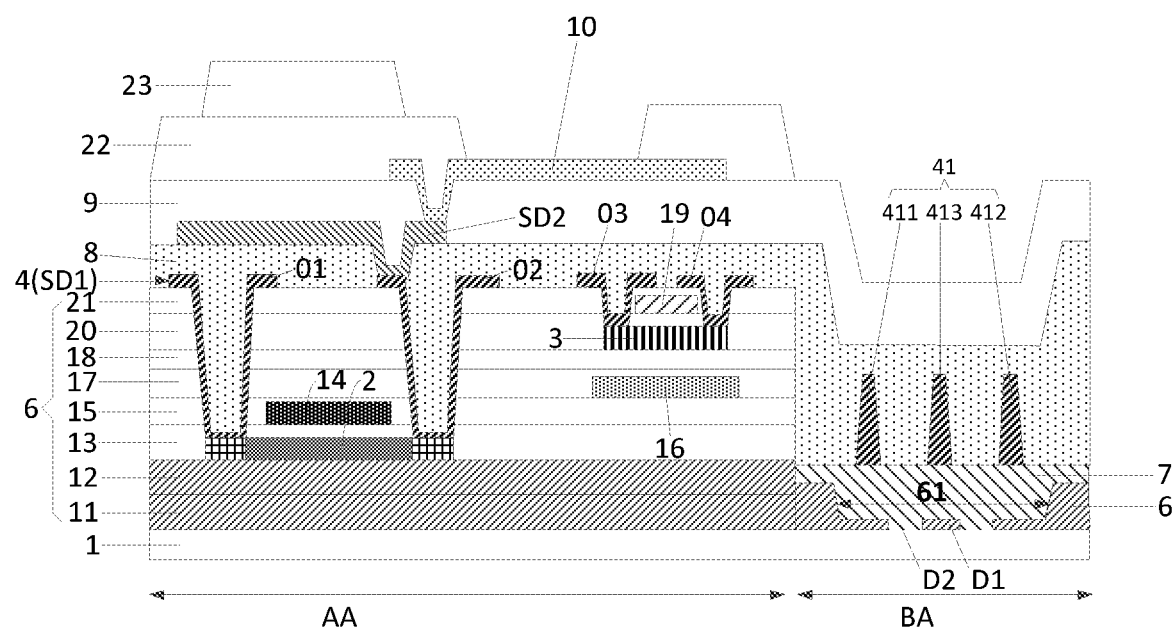
FIG. 5 is a schematic partial cross-sectional structural diagram of another display panel according to the embodiments of the present disclosure.
Figure 8:
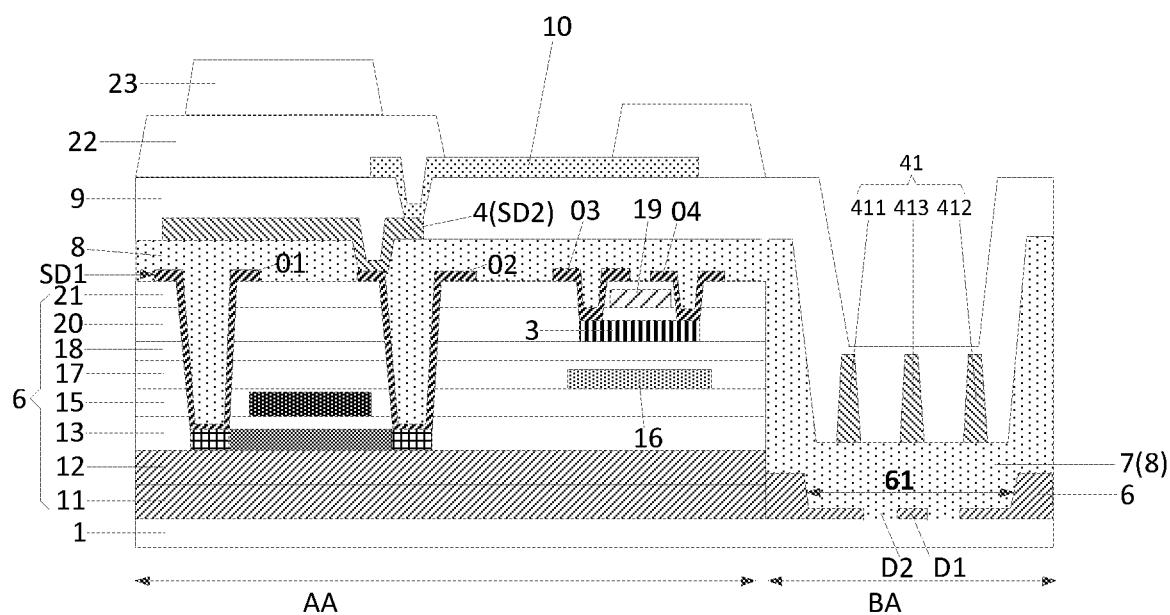
FIG. 8 is a schematic partial cross-sectional structural diagram of another display panel according to the embodiments of the present disclosure.

During specific implementation, in order to further improve the bending performance of the bending region and prevent cracking of the inorganic film layer and the metal traces, in the display panel provided by the embodiment of the present disclosure, as shown in FIGS. 5 and 8, the inorganic layer 6 of the second thickness D2 is disposed between any adjacent traces. Specifically, the traces 41 include: a first trace 411 and a second trace 412 on the outermost sides within the groove 61, and a plurality of third traces 413 (only one third trace 413 is illustrated) between the first trace 411 and the second trace 412. Between the first trace 411 and the third trace 413, between the second trace 412 and the adjacent third trace 413, and between the third traces 413, the inorganic layers 6 each with the second thickness D2 are disposed. The inorganic layer 6 below the first trace 411, the second trace 412 and the third trace 413 has a thickness of D1, i.e., the bending performance of the bending region BA can be further improved in the embodiment of the present disclosure by thinning the thickness of the inorganic layer 6 between the traces.

Figure 6:
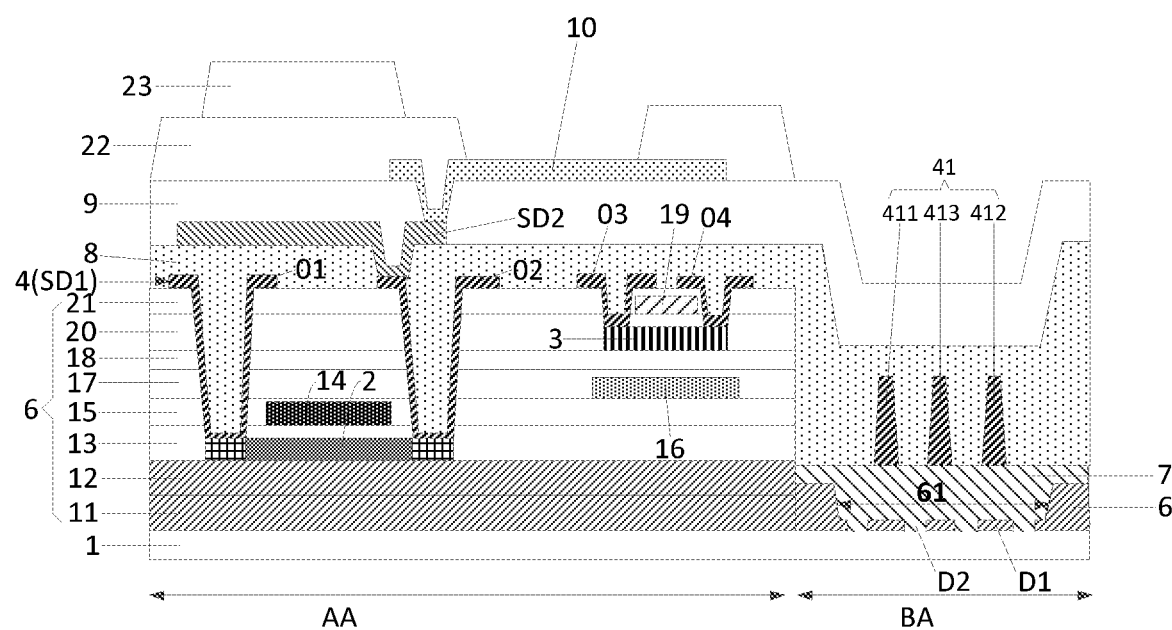
FIG. 6 is a schematic partial cross-sectional structural diagram of another display panel according to the embodiments of the present disclosure.
Figure 9:
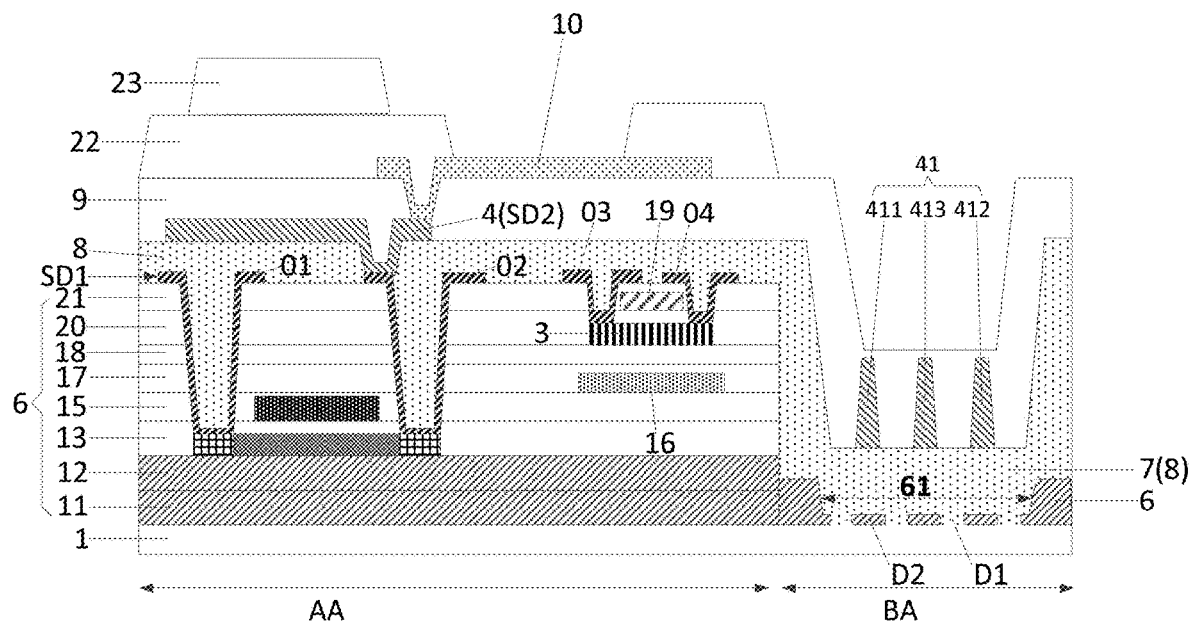
FIG. 9 is a schematic partial cross-sectional structural diagram of another display panel according to the embodiments of the present disclosure.

During specific implementation, in order to further improve the bending performance of the bending region and prevent cracking of the inorganic film layer and the metal traces, in the display panel provided by the embodiment of the present disclosure, as shown in FIGS. 6 and 9, the traces 41 include: first and second traces 411 and 412 on the outermost side within the groove 61, and a plurality of third traces 413 (only one third trace 413 is illustrated) between the first and second traces 411 and 412.

A side of the first trace 411 away from the third trace 413 has the inorganic layer 6 of the second thickness D2, a side of the second trace 412 away from the third trace 413 has the inorganic layer of the second thickness D2, that is, the bending performance of the bending region BA can be further improved in the embodiment of the present disclosure by thinning the thickness of the inorganic layer 6 between the first trace 411 and the third trace 413, between the second trace 412 and the third trace 413, between the adjacent third traces 413, and outside the traces on outermost sides within the groove 61. The thickness of the inorganic layer 6 below the first trace 411, the second trace 412 and the third traces 413 is D1.

During specific implementation, in order to further improve the bending performance of the bending region, and prevent cracking of the inorganic film layer and the metal traces, in the display panel provided by the embodiment of the present disclosure, as shown in FIGS. 4 to 9, the second thickness D2 is 0, that is, the thickness of the inorganic layer 6 below each trace 41 is D1 by hollowing out the inorganic layer 6 between the traces or outside the trace on outermost sides within the groove 61 according to the embodiments of the present disclosure, the thickness of the inorganic layer in the bending region BA can be reduced as much as possible, and the bending performance of the bending region BA can be greatly improved.

During specific implementation, in the display panel provided by the embodiments of the present disclosure, as shown in FIG. 1 and FIGS. 4 to 6, the source-drain metal layer 4 is a first source-drain metal layer SD1, that is, the traces 41 in the bending region BA are located in the first source-drain metal layer SD1. The display panel further includes: a first flat layer 8 on a side of the first source-drain metal layer SD1 away from the base substrate 1, a second source-drain metal layer SD2 on a side of the first flat layer 8 away from the base substrate 1, a second flat layer 9 on a side of the second source-drain metal layer SD2 away from the base substrate 1, and an anode 10 on a side of the second flat layer 9 away from the base substrate 1; and the second source-drain metal layer SD2 is electrically connected with the first source-drain metal layer SD1 by a via penetrating through the first flat layer 8, and the anode 10 is electrically connected with the second source-drain metal layer SD2 by a via penetrating through the second flat layer 9.

Since the material of the flat layers is generally a flexible organic insulating material, the first flat layer 8 and the second flat layer 9 may cover the bending region BA.

During specific implementation, in the display panel provided by the embodiments of the present disclosure, as shown in FIG. 2 and FIGS. 7 to 9, the source-drain metal layer 4 is a second source-drain metal layer SD2, that is, the traces 41 in the bending region BA are in the second source-drain metal layer SD2. The display panel further includes: a first flat layer 8 between the second source-drain metal layer SD2 and the oxide semiconductor layer 3, a first source-drain metal layer SD1 between the first flat layer 8 and the oxide semiconductor layer 3, a second flat layer 9 on a side of the second source-drain metal layer SD2 away from the base substrate 1, and an anode 10 on a side of the second flat layer 9 away from the base substrate 1; and the second source-drain metal layer SD2 is electrically connected with the first source-drain metal layer SD1 by a via penetrating through the first flat layer 8, and the anode 10 is electrically connected with the second source-drain metal layer SD2 by a via penetrating through the second flat layer 9.

Since the material of the flat layers is generally a flexible organic insulating material, the flexible insulating material 7 is the first flat layer 8, that is, when the material of the first flat layer 8 is coated, the material of the first flat layer 8 fills up the groove 61, without separately filling the groove 61 with the flexible insulating material, so that processes and costs are reduced. The second flat layer 9 can cover the bending region BA.

During specific implementation, the display panel provided by the embodiments of the present disclosure, as shown in FIG. 1, FIG. 2 and FIGS. 4 to 9, further includes: a barrier layer 11 and a first buffer layer 12 stacked in sequence between the base substrate 1 and the low temperature poly-silicon semiconductor layer 2, a first gate insulating layer 13, a first gate layer 14, a second gate insulating layer 15, a light-blocking layer 16, a second buffer layer 17 and a third buffer layer 18 stacked in sequence between the low-temperature poly-silicon semiconductor layer 2 and the oxide semiconductor layer 3, a second gate insulating layer 19 between the oxide semiconductor layer 3 and the first source-drain metal layer SD1, a third gate insulating layer 20 between the second gate layer 19 and the oxide semiconductor layer 3, and an interlayer insulating layer 21 between the second gate layer 19 and the first source-drain metal layer SD1.

The barrier layer 11, the first buffer layer 12, the first gate insulating layer 13, the second gate insulating layer 15, the second buffer layer 17, the third buffer layer 18, the third gate insulating layer 20, and the interlayer insulating layer 21 constitute the inorganic layer 6. In particular, the inorganic layer 6 in the display region AA is constituted by the barrier layer 11, the first buffer layer 12, the first gate insulating layer 13, the second gate insulating layer 15, the second buffer layer 17, the third buffer layer 18, and the interlayer insulating layer 19, while the inorganic layer 6 in the bending region BA is treated by an etching process, only part of the inorganic layer 6 remains in order to improve the bending performance of the bending region BA, and the thickness of the inorganic layer 6 in the bending region BA is selected according to practical circumstances.

During specific implementation, as shown in FIG. 1, FIG. 2 and FIGS. 4 to 9, an orthographic projection of the light-blocking layer 16 onto the base substrate 1 covers an orthographic projection of the oxide semiconductor layer 3 onto the base substrate 1. Since the oxide semiconductor layer 3 of the oxide thin film transistor is an oxide material and its performance may be damaged due to the influence of external environmental light, the light-blocking layer 16 provided by the embodiments of the present disclosure may protect the oxide semiconductor layer 3 of the oxide thin film transistor from influence of environmental light, thereby improving the performance of the oxide thin film transistor.

During specific implementation, the material of the gate insulating layers may be one or a combination of silicon oxide or silicon nitride.

During specific implementation, the material of the second buffer layer 17 may be silicon nitride and the material of the third buffer layer 18 may be silicon oxide. Specifically, the second buffer layer 17 and the third buffer layer 18 may function to flatten and improve adhesion between subsequent film layers and the base substrate 1.

During specific implementation, the barrier layer 11 is used to block moisture vapor outside and the first buffer layer 12 is used to improve adhesion between the subsequently fabricated film layers and the base substrate 1. The material of the barrier layer 11 may be one or a combination of silicon oxide and silicon nitride, and the material of the first buffer layer 12 may be silicon oxide.

During specific implementation, as shown in FIG. 1, FIG. 2 and FIGS. 4 to 9, the first source-drain metal layer SD1 includes a first source 01, a first drain 02, a second source 03 and a second drain 04 on a side of the oxide semiconductor layer 3 away from the base substrate 1. The first source 01 and the first drain 02 are electrically connected to the low-temperature poly-silicon semiconductor layer 2, respectively, and the second source 03 and the second drain 04 are electrically connected to the oxide semiconductor layer 3, respectively. Specifically, portions of the low temperature poly-silicon semiconductor layer 2 that are electrically connected to the first source 01 and the first drain 02 are both conductor regions, which can be formed using ion doping.

The first source 01, the first drain 02, the second source 03 and the second drain 04 are in the first source-drain metal layer SD1. In this way, it is only necessary to change the original pattern when the first source 01 and the first drain 02 are formed. The pattern of the second source 03 and the second drain 04 as well as the pattern of the first source 01 and the first drain 02 may be formed by a one-time patterning process, a process for separately preparing the second source 03 and the second drain 04 is not additionally used, the preparation process flow may be simplified, the production cost may be saved, and production efficiency may be improved.

Specifically, the low temperature poly-silicon semiconductor layer 2, the first gate layer 14, the first source 01 and the first drain 02 constitute a low temperature poly-silicon thin film transistor, the oxide semiconductor layer 3, the second gate layer 19, the second source 03 and the second drain 04 constitute an oxide thin film transistor, and an orthographic projection of the low temperature poly-silicon thin film transistor onto the base substrate 1 and an orthographic projection of the oxide thin film transistor onto the base substrate 1 do not overlap with each other.

Specifically, the low-temperature poly-silicon thin film transistor and the oxide thin film transistor are both top-gate thin film transistors.

During specific implementation, the display panel provided by the embodiment of the present disclosure, as shown in FIG. 1, FIG. 2 and FIGS. 4 to 9, further includes: a pixel definition layer 22 on a side of the anode 10 away from the substrate 1, and a spacer layer 23 on the pixel definition layer 22. Specifically, the pixel definition layer 22 has a plurality of pixel openings. A portion of the anode 10 is exposed from each pixel opening, and then a light emitting layer on the side of the anode 10 away from the base substrate 1, as well as a cathode and subsequent other functional film layers such as encapsulation layers are fabricated, which are not described in detail herein. The spacer layer 23 acts as a support for the subsequent alignment of the display panel and a glass cover plate.

Specifically, an anode voltage is input to the anode through the thin film transistor, and a cathode voltage is input to the cathode. In other words, driven by an external voltage, electron-hole pairs at a bound energy level, i.e. excitons which radiate back-exciting photons to generate visible light, are generated by combining electrons injected by the cathode with holes injected by the anode in the light emitting layer.

Of course, the display panel provided by the embodiments of the present disclosure can also include other functional film layers that are well known to those skilled in the art and are not described in detail herein.

Specifically, the display panel provided by the embodiments of the present disclosure is an organic light emitting display panel.

Based on the same inventive concept, an embodiment of the present disclosure also provides a display device including the display panel provided by the embodiments of the present disclosure. The principle of solving the problem of the display device is similar to that of the aforementioned display panel, and thus implementation of the display device can be referred to implementation of the aforementioned display panel, and it is not repeated here.

During specific implementation, the display device provided by the embodiment of the present disclosure may be an organic light emitting display device.

During specific implementation, the display device provided by the embodiment of the present disclosure may be a full-screen display device, or may be a flexible display device, or the like, without limitation.

Figure 10:
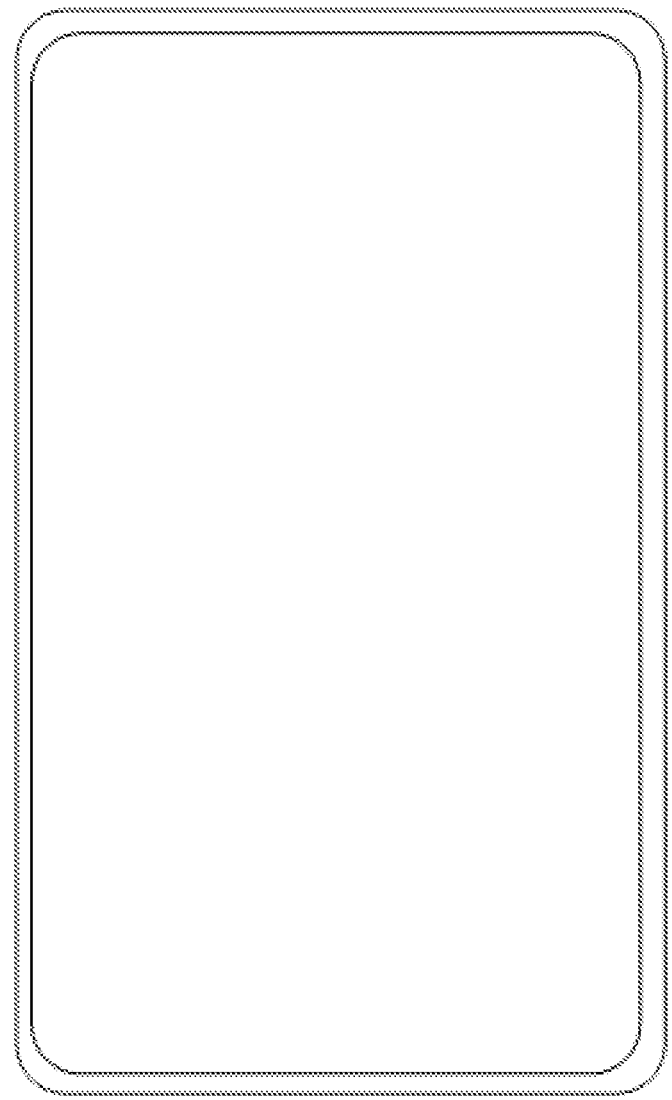
FIG. 10 is a schematic structural diagram of a display device according to the embodiments of the present disclosure.

During specific implementation, the display device provided by the embodiment of the present disclosure may be a full screen cell phone as shown in FIG. 10. Of course, the display device provided by the embodiment of the present disclosure may be any product or component having a display function, such as a tablet computer, a television set, a display, a laptop computer, a digital photo frame, a navigator, or the like. Existence of other essential components of the display device will be understood by those of ordinary skill in the art, which will not be described herein and should not be taken as a limitation on the present disclosure.

As for the display panel and the display device provided by the embodiments of the present disclosure, in the display panel provided by the embodiments of the present disclosure, by digging the groove in the inorganic layer in the bending region in the LTPO display panel and filling up the groove with the flexible insulating material, the bending performance of the bending region can be improved and the problem that the LTPO-based display panel causes cracking of the inorganic film layer and the metal traces are broken under bending can be prevented.

Although the preferred embodiments of the present disclosure have been described, further variations and modifications of these embodiments may be made therein by those skilled in the art once the basic inventive concepts have been known. It is therefore intended that the appended claims be construed to include the preferred embodiments along with all changes and modifications that fall within the scope of the disclosure.

It will be apparent to those skilled in the art that various modifications and variations can be made to the embodiments of the present disclosure without departing from the spirit and scope of the embodiments of the present disclosure. Thus, it is intended that the present disclosure include such modifications and variations of the embodiments of the present disclosure provided they fall into the scope of the present claims and their equivalents.

What is claimed is:

1. A display panel comprising:
a base substrate comprising a display region and a bending region adjacent to the display region;
a low-temperature poly-silicon semiconductor layer in the display region of the base substrate;
an oxide semiconductor layer in the display region of the base substrate;
a source-drain metal layer, wherein the source-drain metal layer corresponding to the bending region is provided with a plurality of mutually insulated traces extending in a first direction and arranged in a second direction; the second direction is a direction of extension of a bending axis within the bending region, and the first direction is a horizontal direction perpendicular to the second direction; and signals on the traces comprise signals transmitted by a transistor in which the low-temperature poly-silicon semiconductor layer is located and signals transmitted by a transistor in which the oxide semiconductor layer is located;
an inorganic layer between the base substrate and the source-drain metal layer, wherein the inorganic layer is provided with a groove in the bending region, and the traces are disposed above the groove; and
a flexible insulating material between the inorganic layer and the traces in the bending region, wherein the flexible insulating material fills the groove;
wherein the inorganic layer has a first thickness and a second thickness at a groove region, the first thickness is larger than the second thickness, in the groove region, the traces are only disposed above the inorganic layer of the first thickness and no traces are disposed above the inorganic layer of the second thickness, and the inorganic layer is an insulating layer; and the traces comprise: first traces and second traces on outermost sides within the groove, and a plurality of third traces between the first traces and second traces; and a side of the first traces away from the third traces has the inorganic layer of the second thickness, a side of the second traces away from the third traces has the inorganic layer of the second thickness, and the inorganic layer of the first thickness is between the first traces and the second traces.

2. The display panel according to claim 1, wherein the flexible insulating material fills up the groove, and a thickness of the flexible insulating material is larger than a depth of the groove.

3. The display panel according to claim 1, wherein any adjacent traces have the inorganic layer of the second thickness therebetween.

4. The display panel according to claim 3, wherein the traces comprise: first traces and second traces on outermost sides within the groove; and
 a side of the first traces away from third traces has the inorganic layer of the second thickness, and a side of the second traces away from the third traces has the inorganic layer of the second thickness.

5. The display panel according to claim 1, wherein the second thickness is 0.

6. The display panel according to claim 1, wherein the source-drain metal layer is a first source-drain metal layer, and the display panel further comprises: a first flat layer on a side of the first source-drain metal layer away from the base substrate, a second source-drain metal layer on a side of the first flat layer away from the base substrate, a second flat layer on a side of the second source-drain metal layer away from the base substrate, and an anode on a side of the second flat layer away from the base substrate; and
 the first flat layer and the second flat layer cover the bending region.

7. The display panel according to claim 1, wherein the source-drain metal layer is a second source-drain metal layer, and the display panel further comprises: a first flat layer between the second source-drain metal layer and the oxide semiconductor layer, a first source-drain metal layer between the first flat layer and the oxide semiconductor layer, a second flat layer on a side of the second source-drain metal layer away from the base substrate, and an anode on a side of the second flat layer away from the base substrate; and
 the first flat layer is made of the flexible insulating material and the second flat layer covers the bending region.

8. The display panel according to claim 6, further comprising: a barrier layer and a first buffer layer stacked in sequence between the base substrate and the low-temperature poly-silicon semiconductor layer, a first gate insulating layer, a first gate layer, a second gate insulating layer, a light-blocking layer, a second buffer layer and a third buffer layer stacked in sequence between the low-temperature poly-silicon semiconductor layer and the oxide semiconductor layer, a second gate layer between the oxide semiconductor layer and the first source-drain metal layer, a third gate insulating layer between the second gate layer and the oxide semiconductor layer, and an interlayer insulating layer between the second gate layer and the first source-drain metal layer; wherein
 the barrier layer, the first buffer layer, the first gate insulating layer, the second gate insulating layer, the second buffer layer, the third buffer layer, the third gate insulating layer, and the interlayer insulating layer constitute the inorganic layer.

9. A display device, comprising the display panel according to claim 1.

10. The display panel according to claim 1, wherein the source-drain metal layer corresponding to the display region is provided with a plurality of mutually insulated signal lines extending in the first direction and arranged in the second direction.

11. The display panel according to claim 1, wherein an orthographic projection of the oxide semiconductor layer onto the base substrate does not overlap with an orthographic projection of the low-temperature poly-silicon semiconductor layer onto the base substrate.

12. The display panel according to claim 7, further comprising: a barrier layer and a first buffer layer stacked in sequence between the base substrate and the low-temperature poly-silicon semiconductor layer, a first gate insulating layer, a first gate layer, a second gate insulating layer, a light-blocking layer, a second buffer layer and a third buffer layer stacked in sequence between the low-temperature poly-silicon semiconductor layer and the oxide semiconductor layer, a second gate layer between the oxide semiconductor layer and the first source-drain metal layer, a third gate insulating layer between the second gate layer and the oxide semiconductor layer, and an interlayer insulating layer between the second gate layer and the first source-drain metal layer; wherein
 the barrier layer, the first buffer layer, the first gate insulating layer, the second gate insulating layer, the second buffer layer, the third buffer layer, the third gate insulating layer, and the interlayer insulating layer constitute the inorganic layer.

13. The display panel according to claim 8, wherein an orthographic projection of the light-blocking layer onto the base substrate covers an orthographic projection of the oxide semiconductor layer onto the base substrate.

14. The display panel according to claim 12, wherein an orthographic projection of the light-blocking layer onto the base substrate covers an orthographic projection of the oxide semiconductor layer onto the base substrate.

15. The display panel according to claim 8, wherein a material of the first, second and third gate insulating layers is one or a combination of silicon oxide or silicon nitride.

16. The display panel according to claim 8, wherein a material of the second buffer layer is silicon nitride and a material of the second and third buffer layers is silicon oxide.

17. The display panel according to claim 6, wherein the first source-drain metal layer comprises a first source, a first drain, a second source and a second drain on a side of the oxide semiconductor layer away from the base substrate; and
 the first source and the first drain each are electrically connected to the low-temperature poly-silicon semiconductor layer, and the second source and the second drain each are electrically connected to the oxide semiconductor layer.

18. The display panel according to claim 7, wherein the first source-drain metal layer comprises a first source, a first drain, a second source and a second drain on a side of the oxide semiconductor layer away from the base substrate; and
 the first source and the first drain each are electrically connected to the low-temperature poly-silicon semiconductor layer, and the second source and the second drain each are electrically connected to the oxide semiconductor layer.

\* \* \* \* \*